(12) United States Patent
Asauchi

(10) Patent No.: US 7,406,576 B2
(45) Date of Patent: Jul. 29, 2008

(54) SEMICONDUCTOR MEMORY DEVICE

(75) Inventor: Noboru Asauchi, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 252 days.

(21) Appl. No.: 11/495,013

(22) Filed: Jul. 28, 2006

(65) Prior Publication Data

US 2007/0050584 A1 Mar. 1, 2007

(30) Foreign Application Priority Data

Aug. 10, 2005 (JP) .............................. 2005-231503

(51) Int. Cl.
*G06F 12/00* (2006.01)
(52) U.S. Cl. ...................... 711/163; 711/103
(58) Field of Classification Search ........................ None
See application file for complete search history.

(56) References Cited

U.S. PATENT DOCUMENTS 7,051,180 B2* 5/2006 Downer et al. .............. 711/173
7,318,129 B1* 1/2008 Falik et al. .................. 711/152
2002/0133680 A1* 9/2002 Rosenquist et al. ......... 711/163

FOREIGN PATENT DOCUMENTS

| JP | 06-309887 A | 11/1994 |
|---|---|---|
| JP | 2001-166649 A | 6/2001 |
| JP | 2002-014870 A | 1/2002 |

* cited by examiner

*Primary Examiner*—Brian R Peugh
(74) *Attorney, Agent, or Firm*—Stroock & Stroock & Lavan LLP

(57) ABSTRACT

A semiconductor device 10 sets a pass-through flag to ON when the top address of a write-prohibited area is passed. When a request to write data to a write-restricted area WRA is received, the semiconductor memory device 10 determines whether or not the pass-through flag is set to ON, and if the pass-through flag is not set to ON, the semiconductor memory device 10 executes writing of the data to the write-restricted area. On the other hand, if the pass-through flag is set to ON, the semiconductor memory device 10 does not execute writing of the data to the write-restricted area.

14 Claims, 8 Drawing Sheets

Fig.2

|   | A0 | A1 | A2 | A3 | A4 | A5 | A6 | A7 |
|---|---|---|---|---|---|---|---|---|
| 1 | 00H | ID | | W/L | WLD | | | 07H |
| 2 | 08H | | | | | | | 0FH |
| 3 | 10H | | | WRA | | | | 17H |
| 4 | 18H | | | | | | | |
| 5 | | | | | | | | |
| 6 | | | | | | | | |
| 7 | | | | | | | | |
| 8 | | | | | | | | |
| 9 | | | | WPA | | | | |
| 10 | | | | | | | | |
| 11 | | | | | | | | |
| 12 | | | | | | | | |
| 13 | | | | | | | | |
| 14 | | | | | | | | |
| 15 | | | | | | | | |
| 16 | | | | | | | | 7FH |

101

|   |   |   |   |   |   |   |   |   |
|---|---|---|---|---|---|---|---|---|
| 17 | 80H | | | | | | | |
| 18 | | | | | | | | |
| 19 | | | | | | | | |
| 20 | | | | | | | | |
| 21 | | | | | | | | |
| 22 | | | | | | | | |
| 23 | | | | | | | | |
| 24 | | | | | | | | BFH |

| WRITE LOCK AREA | 04H | 05H |
|---|---|---|
| 3rd BYTE ONWARD | X | 1 |
| 7th BYTE ONWARD | 1 | 0 |
| 8th BYTE ONWARD | 1 | 1 |

SEMICONDUCTOR MEMORY DEVICE

FIELD OF TECHNOLOGY

The present invention relates to a semiconductor memory device that is accessed sequentially, as well as to an access control method for a semiconductor memory device that is accessed sequentially.

BACKGROUND ART

A semiconductor memory device that permits only sequential access to the data cells of a memory array, such as an EEPROM, is known. This type of semiconductor memory device is used as a memory device for storing data pertaining to the amount of consumables remaining or the amount consumed because it is relatively inexpensive. Furthermore, a technology is known wherein a prescribed data storage area is made write-prohibited (i.e., such area is made read-only) by storing map information for the write-prohibited area in a prescribed area in the memory array of the semiconductor memory device after initial data is written to the prescribed data storage area of such memory array.

SUMMARY OF THE INVENTION

However, in the conventional write-prohibition technology, the problem exists that errors occurring during writing of the initial data to the prescribed data storage area of the semiconductor memory device cannot be prevented. In a sequential-access semiconductor memory device, because the address to be accessed is specified based on the number of input external clock signal pulses, when the clock signal advances due to noise, there is a danger that the address to be accessed can be easily misidentified. For example, where a semiconductor memory device includes a prescribed data storage area that will become a write-prohibited area and that is disposed below a rewritable area, in the conventional art, there is a risk that data that should be stored in the prescribed data storage area may be written to the rewritable area.

The present invention was devised in order to address this problem, and an object of the present invention is to reduce or prevent the erroneous writing of data to a rewritable area in a semiconductor memory device.

In order to address the above problem, a first aspect of the present invention provides a semiconductor memory device. The semiconductor memory device of the first aspect of the present invention comprises a memory array that is sequentially accessed starting with the top address and contains a rewritable area used for storage of rewritable data and a write-prohibited area that is used for storage of read-only data and follows the rewritable area, an access request receiving unit that receives access requests for access of a desired address in said memory array, a flag setting unit that sets a flag to ON when said write-prohibited area has been accessed, and a memory controller that controls access of said memory array and does not write data to said desired address if said desired address is included in said rewritable area and said flag is set to ON.

According to the semiconductor memory device of the first aspect of the present invention has a memory controller that does not write data to the desired address if a desired address is included in the rewritable area with reference to information specifying the write-prohibited area in the memory array and the flag is set to ON. Therefore, erroneous writing of data to the rewritable area may be reduced or prevented.

In the semiconductor memory device of the first aspect of the present invention, the memory controller may execute read-only access of data from said desired address if said access controller determines said desired address is included in said write-prohibited area with reference to information specifying the write-prohibited area in said memory array. In this arrangement, data is not written to the write-prohibited area and only reading of data may be executed.

In the semiconductor memory device of the first aspect of the present invention, the memory controller may write data to said desired address if said access controller determines said desired address is included in said rewritable area but that said flag is not set to ON with reference to information specifying the write-prohibited area in said memory array. In this arrangement, data may be written to the rewritable area.

In the semiconductor memory device of the first aspect of the present invention, said information specifying the write-prohibited area may be written in the area extending from said top address to said rewritable area. In this arrangement, the write-prohibited area may be specified in the initial stage of access of the memory array.

In the semiconductor memory device of the first aspect of the present invention, identification information that identifies said semiconductor memory device may be also written in the area extending from said top address to said rewritable area. In this arrangement, it may be determined in the initial stage of access of the memory array whether a semiconductor memory device is the semiconductor memory device to be accessed.

In the semiconductor memory device of the first aspect of the present invention, the flag setting unit may set the flag to OFF when a reset signal is received. In this arrangement, the writing of data to the rewritable area may be executed via the input of a reset signal.

In the semiconductor memory device of the first aspect of the present invention, the flag ON or flag OFF setting information may be stored in the memory controller. In this arrangement, flag ON/OFF state management may be performed by the memory controller.

In the semiconductor memory device of the first aspect of the present invention, the flag setting unit may set the flag to OFF upon receiving of a reset signal. In this arrangement, writing of data to the rewritable area may be executed via input of a reset signal.

In the semiconductor memory device of the first aspect of the present invention, the memory controller may further comprise a write-prohibition controller that issues a write-prohibit signal that prohibits writing of data to said desired address if said desired address is included in said rewritable area with reference to information specifying the write-prohibited area in said memory array and said flag is set to ON, and a writing execution unit that does not write data to said memory array where a write-prohibit signal is received from said write-prohibition controller. In this arrangement, the erroneous writing of data to the rewritable area may be reduced or prevented by the write-prohibition controller and the writing unit.

A second aspect of the present invention provides a control apparatus for a semiconductor memory device that includes a memory array that is accessed sequentially starting with the top address and that contains a rewritable area used for storage of rewritable data and a write-prohibited area that follows the rewritable area and is used for storage of read-only data. The control device for the semiconductor memory device of the second aspect of the present invention comprises an access request receiving unit that receives access requests for access of a desired address in said memory array of said semiconductor memory device, a flag setting unit that sets a flag to ON when said write-prohibited area has been accessed, and an access controller that controls access of said memory array of said semiconductor memory device, and that does not write data to said desired address if the access controller determines said desired address is included in said rewritable area with reference to information specifying the write-prohibited area in said memory array and that said flag is set to ON.

According to the semiconductor memory device of the second aspect of the present invention has a access controller that does not write data to the desired address if a desired address is included in the rewritable area with reference to information specifying the write-prohibited area in the memory array and the flag is set to ON. Therefore, erroneous writing of data to the rewritable area may be reduced or prevented.

A third aspect of the present invention provides an access control method for a semiconductor memory device that comprises a memory array that is accessed sequentially starting with the top address and that contains a rewritable area used for storage of rewritable data and a write-prohibited area that follows the rewritable area and is used for storage of read-only data. The semiconductor memory device access control method of the third aspect of the present invention comprises receiving an access request for access of a desired address in said memory array, referring to information that specifies the write-prohibited area in said memory array, and not writing data to said desired address if said desired address is included in said rewritable area and if a flag that is set to ON when said write-prohibited area has been accessed is set to ON.

According to the semiconductor memory device access control method of the third aspect of the present invention, the same operation and effect achieved with the semiconductor memory device of the first aspect of the present invention may be achieved, and the semiconductor memory device access control method of the third aspect of the present invention may be implemented in various ways in the same manner as the semiconductor memory device of the first aspect of the present invention.

The method of the third aspect of the present invention may alternatively be implemented as a program or as a computer-readable recording medium on which a program is recorded. Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

FIG. 2 is an explanatory drawing showing in a simplified fashion the internal construction map of a memory array incorporated in the semiconductor memory device of the embodiment;

FIG. 3 is an explanatory drawing showing an example of a map comprising write lock area information stored in the memory array of the semiconductor memory device of the embodiment.

DESCRIPTION OF THE PREFERRED EMBODIMENTS

The semiconductor memory device and semiconductor memory device access control method of the present invention will be described below based on embodiments and with reference to the drawings.

Construction of Semiconductor Memory Device

Figure 1:
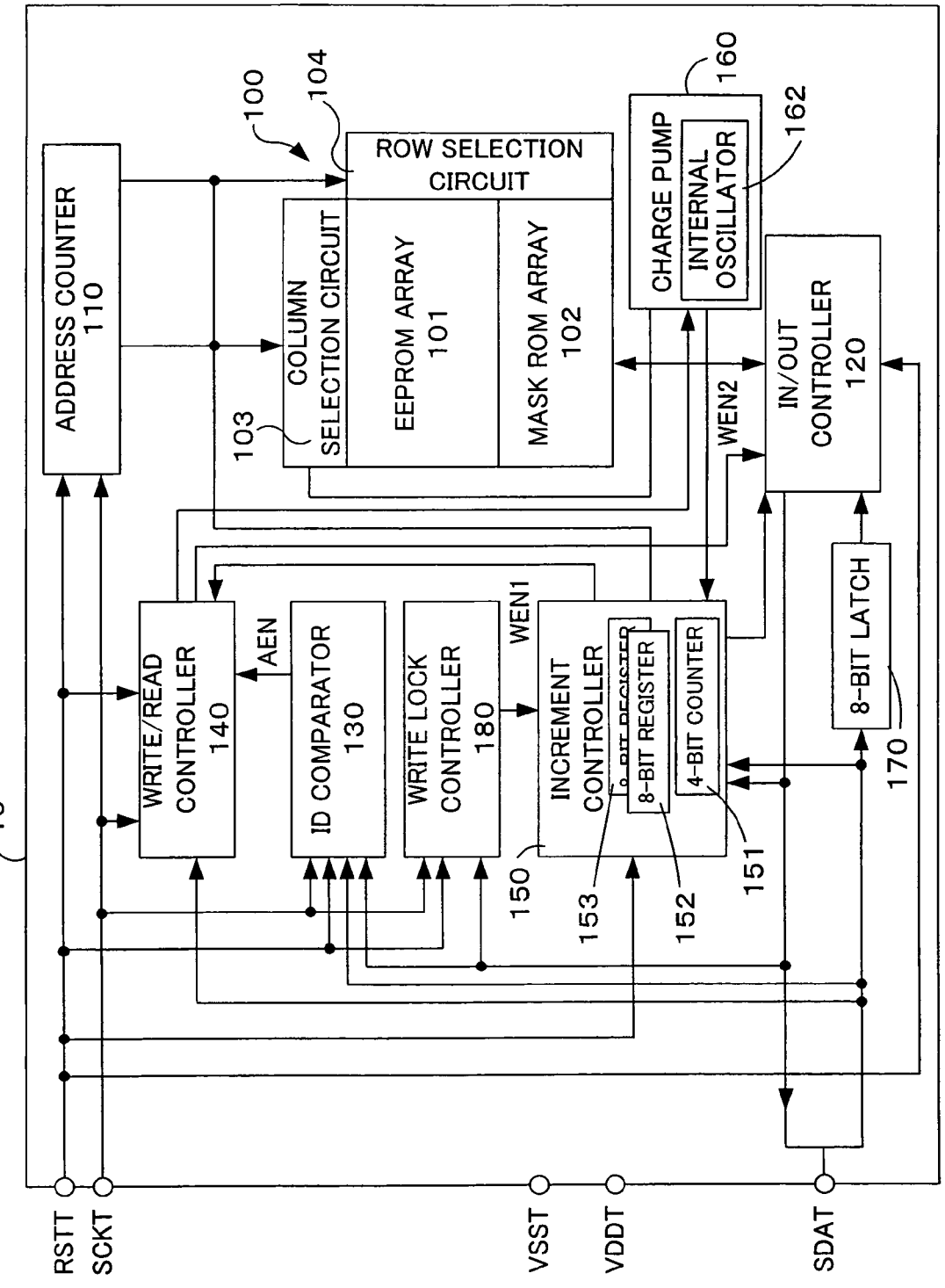
FIG. 1 is a block diagram showing the functional internal construction of a semiconductor memory device of the embodiment.

The construction of the semiconductor memory device of the embodiment is described below with reference to FIGS. 1-3. FIG. 1 is a block diagram showing the functional internal construction of the semiconductor memory device of the embodiment. FIG. 2 is an explanatory drawing showing in a simplified fashion the internal construction map of a memory array incorporated in the semiconductor memory device of the embodiment. FIG. 3 is an explanatory drawing showing an example of a map comprising write lock area information stored in the memory array of the semiconductor memory device of the embodiment.

The semiconductor memory device 10 of the embodiment is a sequential access memory device that does not require the external input of address data to specify the address to be accessed. The semiconductor memory device 10 includes a memory array 100, an address counter 110, an IN/OUT controller 120, an ID comparator 130, a write/read controller 140, an increment controller 150, a charge pump circuit 160, an 8-bit latch register 170, and a write lock controller 180. These circuits are connected via signal lines using a two-way bus connection. In addition, at least the IN/OUT controller 120, ID comparator 130, write/read controller 140, increment controller 150 and write lock controller 180 may be collectively termed a memory controller.

The memory array 100 includes an EEPROM array 101 and a mask ROM array 102. The EEPROM array 101 is a memory area having the characteristics of a data-writable EEPROM in which electrical deletion and writing of data can be performed. The mask ROM array 102 is a memory area having the characteristics of a mask ROM, to which data is written during the manufacturing process and in which data deletion and rewriting are disabled.

The EEPROM array 101 and mask ROM array 102 of the memory array 100 contain a plurality of data cells (memory cells) that store one-bit items information and are shown in FIG. 2 in a simplified fashion. In the embodiment, the memory array 100 includes one row of eight addresses (i.e., addresses for eight bits of data) as prescribed address units, as shown in FIG. 2. For example, with respect to the EEPROM array 101, one row contains eight data cells (eight bits) and one column contains 16 data cells (16 words), such that 16 words×8 bits (=128 bits) of data can be stored. With respect to the mask ROM array 102, one row contains eight data cells (eight bits) and one column contains 8 data cells (8 words), such that 8 words×8 bits (=64 bits) of data can be stored.

An address map of the memory array 100 will now be described with reference to FIG. 2. The memory array 100 of the embodiment includes the EEPROM array 101 and mask ROM array 102 as described above. The top three addresses of the EEPROM array 101 (the columns A0-A2 of the first row, comprising three bits) store ID information to identify the particular semiconductor memory device. The fourth address (the column A4 of the first row) stores write protect information (W/L) that indicates whether or not writing to a prescribed area (data storage area) of the EEPROM memory array 101 is prohibited. The fifth and sixth addresses (the columns A5, A6 of the first row) store write lock area information WLD that specifies the prescribed area to which writing is prohibited. Because the writing of data to the EEPROM memory array 101 is carried out after the ID information and write protect information (W/L) is read out from the first row including the top six addresses, no data can be written to the first row after factory shipment.

In the embodiment, with respect to the write protect information (W/L), a value of '1' in the fourth address indicates that writing to the prescribed area is prohibited, for example, while a value of '0' in the same address indicates that writing to the prescribed area is permitted. For example, as shown in FIG. 3, the write lock area information WLD that specifies the prescribed area is used to specify the prescribed area through a combination of the values stored in the fourth and fifth addresses. In the example shown in FIG. 3, in the case of a combination of a value of 'X (null value)' in the fourth address and '1' in the fifth address, the area from the third byte onward excluding the first row (i.e., the area from the fourth byte onward if counted from the beginning) is deemed the prescribed area. In other words, this situation corresponds to the memory map shown in FIG. 2. In the case of a combination of '1' in the fourth address and '0' in the fifth address, the area from the seventh byte onward excluding the first line (i.e., the area from the from the eighth byte onward if counted from the beginning) is deemed the prescribed area. Furthermore, in the case of a combination of '1' in the fourth address and '1' in the fifth address, the area from the eighth byte onward excluding the first line (i.e., the area from the from the ninth byte onward if counted from the beginning) is deemed the prescribed area.

The example of FIG. 2 will now be specifically described. The $9^{th}$ address (08H) through the $16^{th}$ address (0FH) and the $17^{th}$ address (10H) through the $24^{th}$ address (17H) of the EEPROM array 101 constitute a rewritable area in which 16-bit rewritable information is stored under certain conditions. In the embodiment, the rows comprising the $9^{th}$ through $16^{th}$ and $17^{th}$ through $24^{th}$ addresses may be termed write-restricted rows; alternatively, each group of eight addresses in the $9^{th}$ through $16^{th}$ and $17^{th}$ through $24^{th}$ addresses may be termed write-restricted storage addresses belonging to a prescribed address unit. The certain conditions include, for example, cases in which (1) where the stored information is information relating to ink consumption, the value of the data to be written is larger than the value of the existing data, or (2) where the stored information is information relating to the remaining ink amount, the value of the data to be written is smaller than the existing data.

Where writing to the area from the $25^{th}$ address of the EEPROM array 101 onward, i.e., the area from the fourth byte from the beginning onward, is prohibited based on the write protect information (W/L), such area is termed a write-prohibited area (read-only area) WPA. Specifically, prior to factory shipment, the write-protect information (W/L) is '0', and by writing initial data and setting the write-protect information (W/L) to '1' at the time of factory shipment, the rewriting or writing of data to the $25^{th}$ address onward becomes prohibited. The attributes of each of these addresses (i.e., the address map) are not limited to those described, and may be determined such that the address map includes in addition to the write-restricted area WRA a writable area in which there is no restriction on the writing of data. Furthermore, where the area from the $7^{th}$ byte onward excluding the first row is deemed the write-prohibited area WPA, the area from the second row to the seventh row is deemed the write-restricted area WRA, and where the area from the $8^{th}$ byte onward excluding the first row is deemed the write-prohibited area WPA, the area from the second row to the eighth row is deemed the write-restricted area WRA.

The mask ROM array 102 is a memory array to which information (data) is written during the memory array's manufacture, but after manufacture of the memory array, even prior to factory shipment, writing can no longer be carried out. The mask ROM array 102 is a 64-bit data storage area, and the highest address that can be specified for the mask ROM array 102 is 192 (BFH), but the memory array 100 includes a circuit construction in which dummy data (such as '0') is output up to the $256^{th}$ address (FFH) even after the highest address of the mask ROM array 102 has been exceeded. As a result, the memory array 100 is an easy-to-use memory array that includes, in a virtual fashion, two 128-word×128 bit storage areas.

The memory array 100 of the embodiment includes a plurality of rows comprising eight bits as described above, but each row is not an independent data cell array, and rather is implemented by folding a single data cell array back on itself multiple times in units of eight bits, so to speak. In other words, the row that includes the $9^{th}$ bit is termed the second byte, while the row that includes the $17^{th}$ bit is termed the third byte for the sake of convenience. As a result, in order to access a desired address in the memory array 100, access must be carried out sequentially from the beginning. Access must be implemented using the so-called sequential-access method, and direct access of a desired address, which is possible using the random-access method, cannot be performed.

A word line and a bit (data) line are connected to each data cell in the memory array 100, and data is written to a data cell by selecting the corresponding word line (row) (i.e., by impressing a selection voltage) and impressing a writing voltage to the corresponding bit line. In addition, data ('1' or '0') is read out from a data cell by selecting the corresponding word line (row), connecting the corresponding bit line to the IN/OUT controller 120, and detecting whether or not current exists. The prescribed address unit in the embodiment may be deemed the number of addresses (number of data cells) to which writing may be carried out by impressing a writing voltage to one word line.

The column selection circuit 103 connects columns (bit lines) to the IN/OUT controller 120 in a sequential fashion based on the number of external clock pulses counted by the address counter 110. For example, the column selection circuit 103 selects a bit line based on the values of the lower four bits of the eight bit values indicating the number of clock pulses counted by the address counter 110.

The row selection circuit 104 impresses a selection voltage to rows (word lines) in a sequential fashion based on the number of external clock pulses counted by the address counter 110. For example, the row selection circuit 104 selects a word line based on the values of the upper four bits of the eight bit values indicating the number of clock pulses counted by the address counter 110. In this way, in the semiconductor memory device 10 of the embodiment, the memory array 100 is not accessed using address data, but rather a desired address is accessed based on the number of clock pulses counted by the address counter 110.

The address counter 110 is connected to a reset signal terminal RSTT, a clock signal terminal SCKT, the column selection circuit 103, the row selection circuit 104 and the write/read controller 140. The address counter 110 is reset to the initial value through the setting of the reset signal input via the reset signal terminal RSTT to '0' (or 'Low'), and counts (i.e., increments the count value of) the number of clock pulses synchronously with the falling of the clock pulses input via the external clock signal terminal SCKT after the reset signal is set to '1'.

The address counter 110 used in the embodiment is an eight-bit address counter that stores eight numbers of clock pulses corresponding to the number of data cells (i.e., number of bits) in one row of the memory array 100. The initial value may be any value that is associated with the initial position of the memory array 100, and in general '0' is used as the initial value.

The address counter 110 includes a carry-up unit 111 that sets the maximum count value for the number of clock pulses to be counted. The address counter 110 returns the count value to the initial value corresponding to the top position of the memory array 100 when the number of clock pulses counted reaches the maximum count value. In other words, the address specified by the address counter 110 becomes the top address of the memory array 100.

In the embodiment, as described above, a memory array 100 that includes an EEPROM array 101 and a mask ROM array 102 is used. The EEPROM array 101 includes the 128 addresses from the top address (00H) to the $128^{th}$ address (7FH), while the mask ROM array 102 includes the 64 addresses from the $129^{th}$ address (80H) to the $192^{nd}$ address (BFH). The mask ROM array 102 is a storage area for 64 bits of data, and the highest address of the mask ROM array 102 that cal be logically specified is 192, but as described above, after the highest address of the mask ROM array 102 is exceeded, dummy data is output until the address reaches 256 (FFH).

The IN/OUT controller 120 is a circuit that transfers to the memory array 100 write data input to a data signal terminal SDAT, or receives data read out from the memory array 100 and outputs such data to the data signal terminal SDAT. The IN/OUT controller 120 is connected to the data signal terminal SDAT, the reset signal terminal RSTT, the memory array 100 and the write/read controller 140, and controls the switching between the data transfer direction for data transferred to the memory array 100 based on a request from the write/read controller 140 and the data transfer direction for data transferred to the data signal terminal SDAT (i.e., to the signal line connected to the data signal terminal SDAT) based on a request from the write/read controller 140. An eight-bit latch register 170 that temporarily stores write data input from the data signal terminal SDAT is connected to the input signal line extending from the data signal line SDAT connected to the IN/OUT controller 120.

In the eight-bit latch register 170, the data strings (MSB) input from the data signal terminal SDAT via the input signal line are collected until they total eight bits, and when eight bits' worth of data is collected, the collected eight bits of data are written to the EEPROM array 101. The eight-bit latch register 170 is a so-called FIFO shift register, and when the ninth bit of input data is latched, the data for the already latched first bit is released.

The IN/OUT controller 120 sets the data transfer direction for the memory array 100 to the read-out direction on power ON or reset and prohibits data from being input to the data signal terminal SDAT by setting the input signal line between the eight-bit latch register 170 and the IN/OUT controller 120 to high impedance. This state is maintained until a write request is input from the write/read controller 140. Therefore, the 4-bit data at the beginning of the data string input via the data signal terminal SDAT after the reset signal is input is not written to the memory array 100, and is instead sent to the ID comparator 130. As a result, the top four bits of the memory array 100 become read-only.

The ID comparator 130 is connected to the clock signal terminal SCKT, the data signal terminal SDAT and the reset signal terminal RSTT, and determines whether or not the identification data included in the data string input via the data signal terminal SDAT matches the identification data stored in the memory array 100 (i.e., the EEPROM array 101). To describe this process in more detail, the ID comparator 130 obtains the first three bits of data, i.e., identification data, from the operation code input following input of the reset signal RST. The ID comparator 130 has a three-bit register (not shown) that stores the identification data included in the input data string and a three-bit register (also not shown) that stores the identification data comprising the first three bits obtained from the memory array 100 via the IN/OUT controller 120, and determines whether or not the identification data strings match based on whether or not the values for the two registers match. The ID comparator 130 outputs an access enable signal EN to the write/read controller 140 if the two identification data strings match. The ID comparator 130 clears the registers when a reset signal RST (RST='0' or 'Low') is input.

The write/read controller 140 is connected to the IN/OUT controller 120, the ID comparator 130, the increment controller 150, the charge pump circuit 160, the clock signal terminal SCKT, the data signal terminal SDAT and the reset signal terminal RSTT. The write/read controller 140 is a circuit that verifies the write/read control information included in the data string input via the data signal terminal SDAT synchronously with the fourth clock signal following input of the reset signal RST (i.e., the information in the fourth bit following the 3-bit ID information) and switches the internal operation of the semiconductor memory device 10 to either writing or reading.

Specifically, when a write enable signal AEN is input from the ID comparator 130 and a write enable signal WEN1 is input from the increment controller 150, the write/read controller 140 interprets the obtained write/read command. If the command is a write command, when the write/read controller 140 receives input of the number of clock pulses corresponding to the top address of the write-restricted area WRA, it switches the data transfer direction of the IN/OUT controller 120's bus signal line to the write direction, issues a write enable signal WEN2 that permits writing and sends a write voltage generation request to the charge pump circuit 160. When the number of clock pulses corresponding to the end address of the write-restricted area WRA is received, the write/read controller 140 switches the data transfer direction of the bus signal line of the IN/OUT controller 120 to the read direction, ends transmission of the write enable signal WEN2 that permits writing, and issues a write voltage termination request to the charge pump circuit 160.

If the command is a read command, when the number of clock pulses corresponding to the top address of the write-prohibited area is received, the write/read controller 140 switches the data transfer direction of the bus signal line of the IN/OUT controller 120 to the read direction.

In the embodiment, where write data DI written to one or more write-restricted rows is data comprising an attribute that increases in value (an increment characteristic), it is determined whether or not the write data DI is larger than the existing data DE already stored in the write-restricted rows, and if the write data DI is data comprising an attribute that decreases in value (a decrement characteristic), garbling of the write data DI and erroneous input of data are reduced or prevented by determining whether or not the write data DI comprises a value smaller than the existing data DE already stored in the write-restricted rows. This function is supplied by an increment controller in the former case and by a decrement controller in the latter case. In the example of this embodiment described below, the former case is assumed.

The increment controller 150 is connected to the reset signal terminal RSTT, the write/read controller 140, the charge pump circuit 160 and the write lock controller 180 via signal lines. The increment controller 150 has an internal 4-bit counter 151 and internal 8-bit counters 152, 153. The increment controller 150 determines whether or not write data DI written in the write-restricted rows comprises a value larger than the existing data DE already stored in the write-restricted rows, and determines whether or not the data written to the EEPROM array 101 is correctly written (i.e., performs verification).

The increment controller 150 reads out the existing data DE from the write-restricted rows at the moment at which the write data DI is latched to the 8-bit register 170 and stores it in the 8-bit internal register 152 incorporated therein. The increment controller 150 carries out a bit-by-bit comparison of the read existing data DE and the write data DI input to the 8-bit latch register 170, and determines whether or not the write data DI comprises data having a value larger than that of the existing data DE. In order to speed up processing and reduce the size of the circuit, it is preferred that the input write data comprise MSB.

If the write data DI comprises a value larger than that of the existing data DE, the increment controller 150 outputs a write enable signal WEN1 to the write/read controller 140. If there are multiple write-restricted rows, the increment controller 150 outputs the write enable signal WEN1 only if the write data DI comprises data having a larger value than that of the existing data DE for all write-restricted rows. In addition, as described below, if a notification has been received from the write lock controller 180 indicating that a write enable signal WEN1 should not be issued, the increment controller 150 does not issue the write enable signal WEN1.

After the write data is written, the increment controller 150 verifies whether or not the data was written correctly, and if it is determined that the write data was not written correctly, the existing data DE stored in the internal 8-bit internal register 152 is re-written to the memory array 100. When the write data is verified, the 4-bit counter 151 incorporated in the increment controller 150 begins counting up upon receiving internal clock signal from an internal oscillator 162 belonging to the charge pump circuit 160 at an 8-bit delay relative to the external signal, starting from the write standby state. The count value counted up by the 4-bit counter 151 is input to the column selection circuit 103 and the row selection circuit 104, whereupon the just-written existing data DE is read out.

The charge pump circuit 160 is a circuit that supplies to the selected bit line via the column selection circuit 103 a write voltage necessary to write data to the EEPROM array 101 based on a request signal from the write/read controller 140. The charge pump circuit 160 includes an internal oscillator 162 that generates an operation frequency required during a step-up in voltage and generates the necessary write voltage by stepping up the voltage obtained via the positive electrode power terminal VDDT.

The write lock controller 180 is connected to the clock signal terminal SCKT, the data signal terminal SDAT, the reset signal terminal RSTT and the increment controller 150. The write lock controller 180 refers to the write protect information (W/L) that is stored in the fourth bit of the memory array 100 and is output to the data signal terminal SDAT via the IN/OUT controller 120 when access to the memory array 100 begins. Where the write protect information (W/L)=1, the write lock controller 180 determines that writing to the write-prohibited area WPA of the EEPROM array 101 is prohibited and notifies the increment controller 150 that a write enable signal WEN1 should not be issued in response to a request to perform writing to the write-prohibited area WPA.

When the top address of the write-prohibited area WPA is passed, the write lock controller 180 of the embodiment further also sets a pass-through flag to 'ON' (i.e., to '1') indicating that the write-prohibited area WPA has been passed. Specifically, the write lock controller 180 determines whether or not the top address of the write-prohibited area WPA has been accessed by counting up the number of clock signal pulses input from the clock signal terminal SCKT. The write lock controller 180 sets the pass-through flag to OFF (i.e., '0') upon receiving input of a reset signal RST.

Where the write protect information (W/L)='1' and the pass-through flag is set to ON, the write lock controller 180 instructs the increment controller 150 not to issue a write enable signal WEN1 even if a request to write data to the write-restricted area WRA is received. As a result, where the write-restricted area WRA is to be accessed after passing through the terminal address of the EEPROM array 101, a write enable signal WEN2 is not issued by the write/read controller 140 and writing of data to the write-restricted area WRA is not performed. If the write protect information (W/L)='1' and the pass-through flag is not set to ON, on the other hand, because writing to the write-restricted area WRA of the EEPROM array 101 is permitted, the write lock controller 180 does not send a notification instructing the increment controller 150 to prohibit issuance of the write enable signal WEN1.

Figure 4:
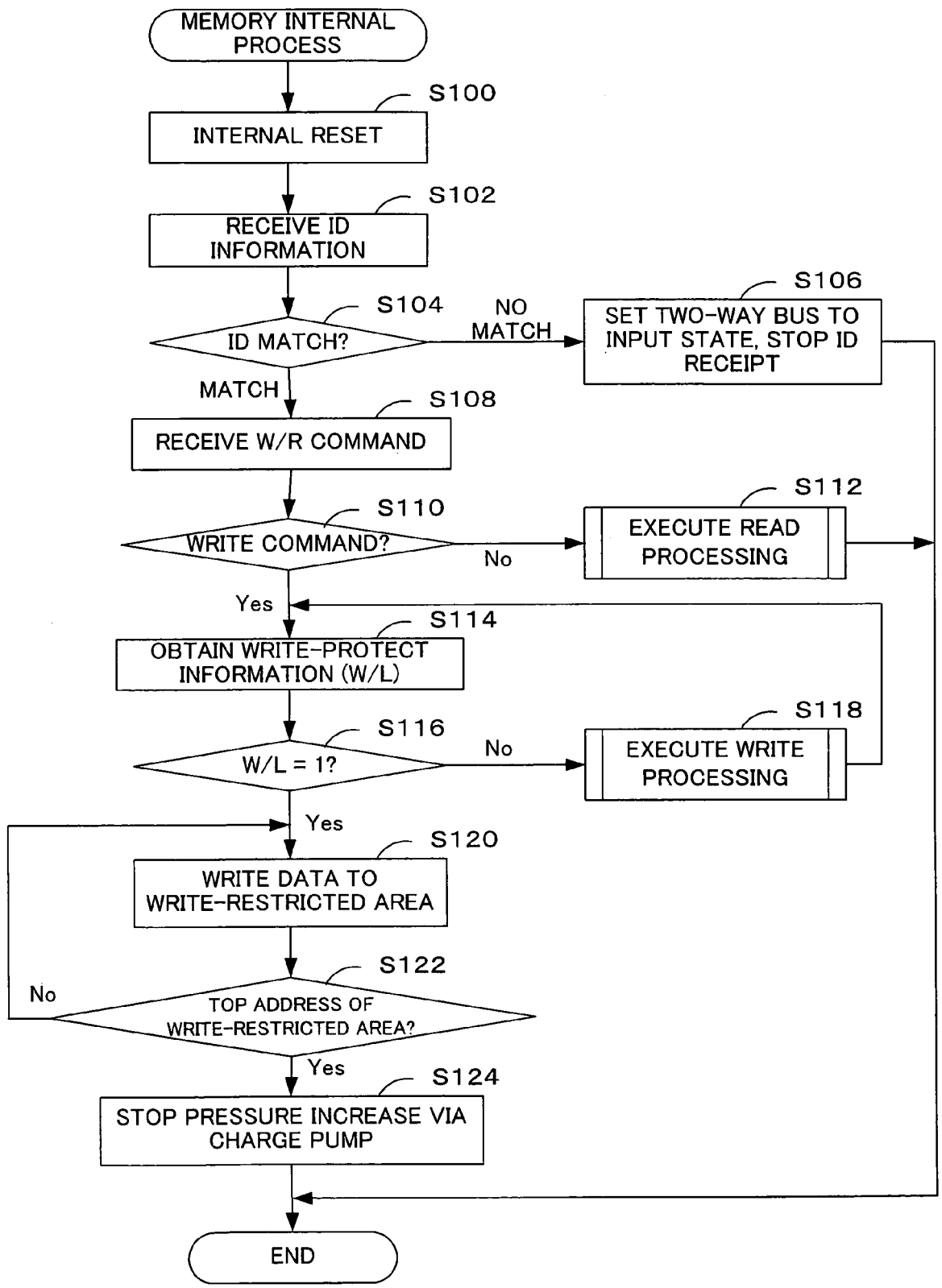
FIG. 4 is a flow chart showing the sequence of operations of the memory internal processing executed by the semiconductor memory device of the embodiment.
Figure 5:
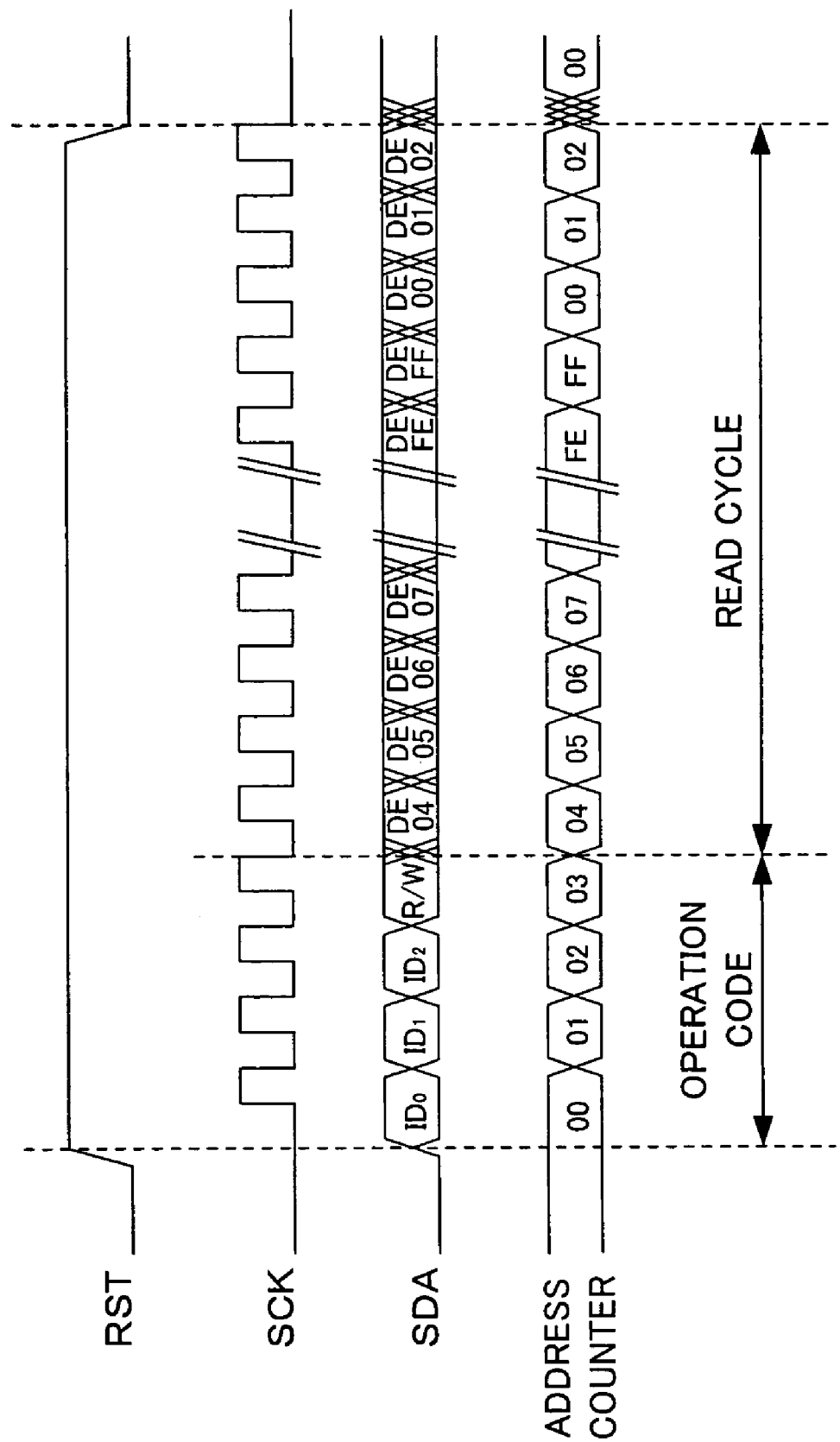
FIG. 5 is a timing chart showing the temporal relationships among the reset signal RST, the external clock signal SCK, the data signal SDA and the address counter value during execution of a read operation.
Figure 6:
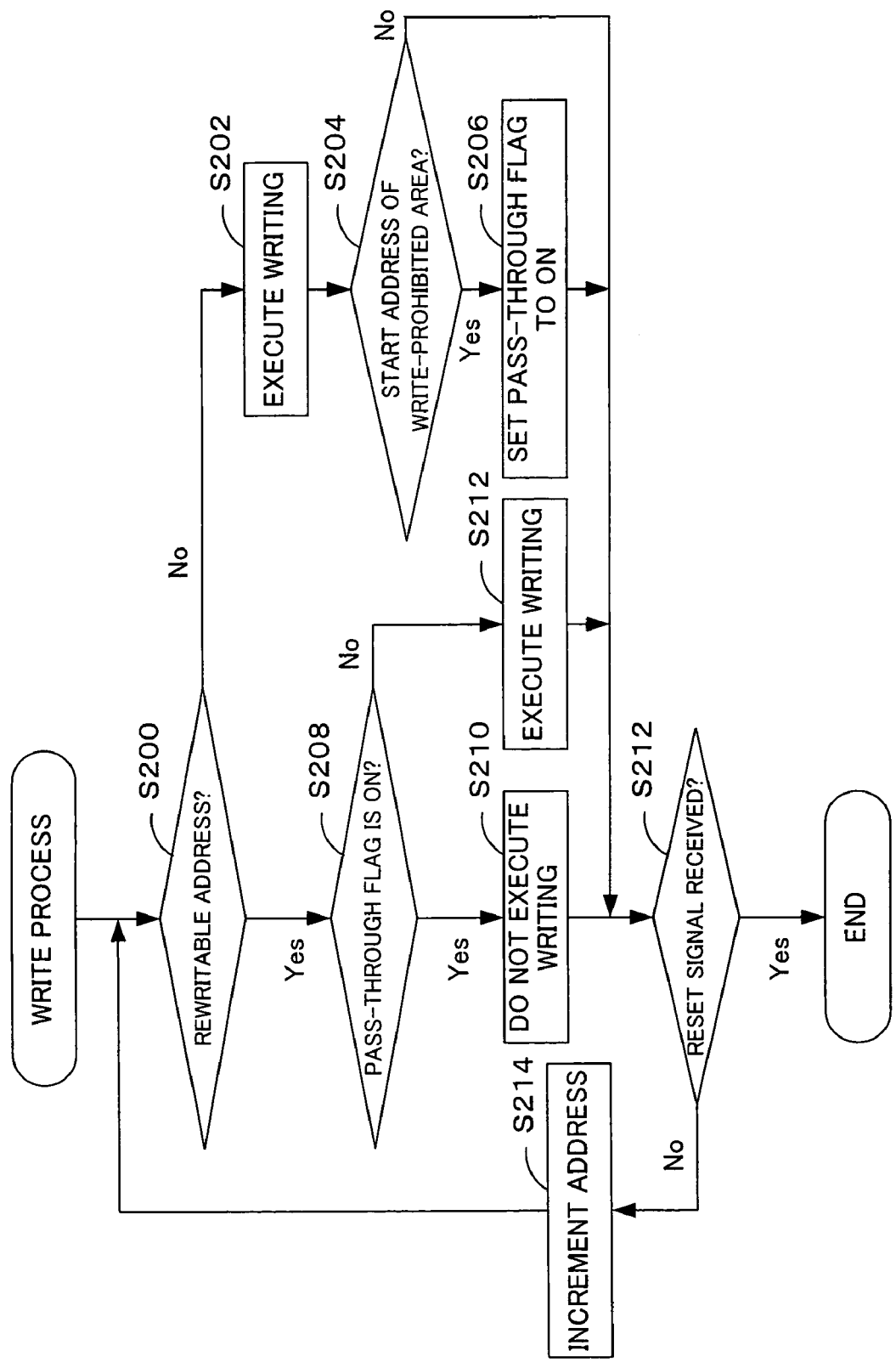
FIG. 6 is a flow chart showing the sequence of operations of the write process executed by the semiconductor memory device of the embodiment.
Figure 7:
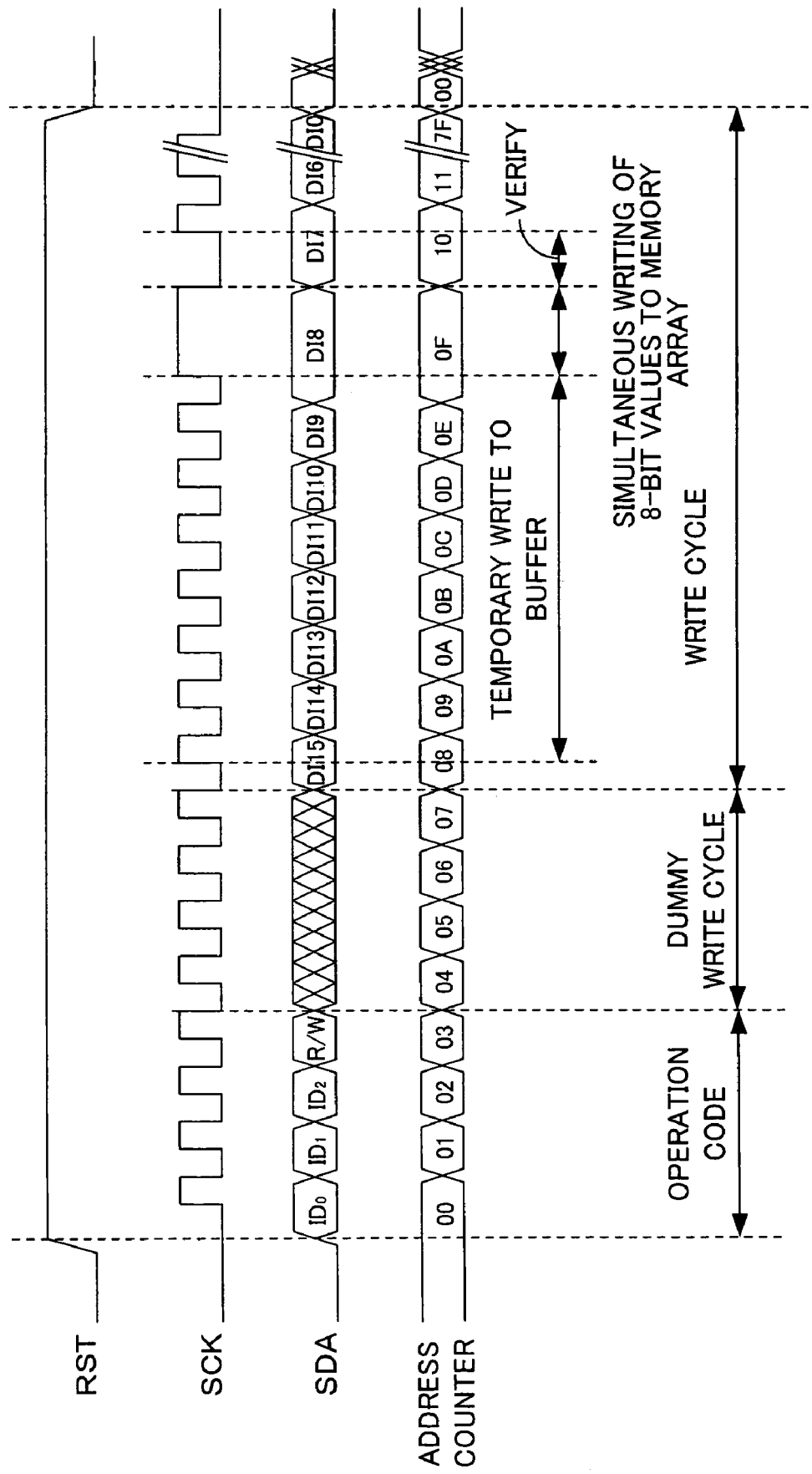
FIG. 7 is a timing chart showing the temporal relationships among the reset signal RST, the external clock signal SCK, the data signal SDA and the address counter value during execution of a write operation.

The internal processing executed in the semiconductor memory device 10 of the embodiment will now be described with reference to FIGS. 4-7. FIG. 4 is a flow chart showing the sequence of operations of the memory internal processing executed by the semiconductor memory device 10 of the embodiment. FIG. 5 is a timing chart showing the temporal relationships among the reset signal RST, the external clock signal SCK, the data signal SDA and the address counter value during execution of a read operation. FIG. 6 is a flow chart showing the sequence of operations of the write process executed by the semiconductor memory device 10 of the embodiment. FIG. 7 is a timing chart showing the temporal relationships among the reset signal RST, the external clock signal SCK, the data signal SDA and the address counter value during execution of a write operation.

In the memory internal processing, first, processing to verify the identification information and the read/write command is performed based on an operation code, as shown in FIG. 5. When a reset state (RST='0' or 'Low') is cleared (such that RST='1' or 'High') by the host computer (see FIG. 9, for example), the semiconductor memory device 10 executes an internal reset (step S100) and begins the memory array 100 access process. Specifically, the IN/OUT controller 120, the ID comparator 130, the write/read controller 140, the increment controller 150 and the write lock controller 180 are initialized by the internal reset.

The ID comparator 130 of the semiconductor memory device 10 obtains the 3-bit identification information input from the host computer (step S102) and executes ID verification processing to determine whether or not the obtained identification information matches the identification information stored in the memory array 100 (step S104). Specifically, the ID comparator 130 obtains the data input to the data signal terminal SDAT synchronously with the leading edges of the three clock signal SCK issued following the switching of the reset signal RST from 'Low' to 'High', i.e., the 3-bit identification information, and stores it in the first 3-bit register. At the same time, the ID comparator 130 obtains the identification information ID0, ID1, ID2 from the first 3-bit addresses of the memory array 100 specified by the count values 00, 01, 02 in the address counter 110 and stores them in the second 3-bit register.

The ID comparator 130 determines whether or not the identification information stored in the first and second registers match, and if they do not match (step S104: No match), sets the two-way bus signal line connected to the data signal terminal SDAT to the input state, ends receipt of identification information ID (step S106), and ends this routine. Because the IN/OUT controller 120 maintains a high-impedance state for the input signal line between the 8-bit latch register 170 and the IN/OUT controller 120, access of the memory array 100 is not permitted. If the identification information stored in the first and second registers do match, on the other hand (step S104: Match), an access enable signal AEN is output to the write/read controller 140.

The write/read controller 140 that receives the access enable signal AEN obtains from the host computer the command bit input to the bus signal line via the data signal terminal SDAT synchronously with the leading edge of the $4^{th}$ clock signal SCK following the switching of the reset signal RST from 'Low' to 'High' (step S108). The write/read controller 140 determines whether or not the obtained command bit is a write command (step S110), and if the obtained command bit is not a write command (step S110: No), the write/read controller 140 outputs a read command to the IN/OUT controller 120 and executes data read processing (step S112). The IN/OUT controller 120 that receives the read command changes the data transfer direction for the memory array 100 to the read direction (output state) and permits data transfer from the memory array 100.

The address counter 110 of the semiconductor memory device 10 counts up synchronously with the trailing edges of the clock signal SCK and counts the number of input clock pulses.

Because the counter value of the address counter 110 after operation code input is '04', reading begins from the existing data DE stored in address 04H of the memory array 100. The memory array 100 of the semiconductor memory device 10 of the embodiment only has addresses in the range OOH-BFH, but the address counter 110 counts up to 256 bits (address FFH). The addresses C0H-FFH represent a virtual area, i.e., the corresponding addresses do not exist in the memory array 100, and during the period that this virtual area is being accessed, the value '0' is output to the data signal terminal SDAT. When the address counter 110 counts the number of clock pulses corresponding to the address FFH, i.e., 256, the address in the memory array 100 specified by the address counter 110 returns to the address 00H. In other words, at the moment that all of the values (bits) in the 8-bit register of the address counter 110 become '1', the top address OOH of the EEPROM array 101 of the memory array 100 is specified as the next address to be accessed.

The existing data DE stored in the memory array is output sequentially to the data signal terminal SDAT via the IN/OUT controller 120 synchronously with the trailing edges of the clock signal SCK during the read cycle period shown in FIG. 5, and the output existing data DE is retained until the trailing edge of the next clock signal SCK. When a clock signal SCK falls, the count value of the address counter 110 is incremented by 1, and as a result, the existing data DE stored in the next address (data cell) in the memory array 100 is output to the data signal terminal SDAT. This operation is repeated synchronously with the clock signal SCK until the desired address is reached. In other words, because the semiconductor memory device 10 of the embodiment is a sequential access-type storage device, the host computer must issue the number of clock signal pulses corresponding to the address to which reading or writing is desired to increment the count value of the address counter 110 up to the count value corresponding to the desired address. As a result, the existing data DE is read out sequentially from the addresses specified via the counter values of the address counter 110 that is sequentially incremented synchronously with clock signal SCK.

The host computer specifies and obtains desired address data by associating the data output from the semiconductor memory device 10 with the number of clock pulses output to the semiconductor memory device 10.

After the read operation is completed, a '0' or 'Low' reset signal RST is input from the host computer and the semiconductor memory device 10 enters the standby state to receive an operation code. When a reset signal RST (='0' or 'Low') is input, the address counter 110, IN/OUT controller 120, ID comparator 130, write/read controller 140, increment controller 150 and write lock controller 180 are initialized.

The write/read controller 140 determines whether or not the obtained command bit is a write command (step S110). If the write/read controller 140 determines that the obtained command bit is a write command (step S110: Yes), the write lock controller 180 obtains the write protect information (W/L) from the fourth address of the EEPROM array 101 (O3H).

The write lock controller 180 determines whether or not write lock is set to ON, i.e., whether or not the write protect information (W/L)='1' (step S116). If it is determined by the write lock controller 180 that write lock is not ON (step S116: No), write processing is executed (step S118). The write process executed here is a process that includes the writing of data to the write-prohibited area WPA of the EEPROM array 101, and comprises a process to write read-only data to the EEPROM array 101. Because the write protect information (W/L) is set to ON, i.e., to '1', when the initial data is written, after factory shipment, the write protect information (W/L) is '1', and the write process executed here is not performed. If the write protect information (W/L) is not ON, the write data increment determination process executed by the increment controller 150 is not performed. In other words, the writing of write data to the desired address is carried out without comparing the relative sizes of the values of the write data sent from the host computer and the existing data in the EEPROM array 101.

The write process executed in step S118 will now be described with reference to FIG. 6. Clock signal SCK of the number corresponding to the address sought to be accessed, i.e., the address to which data writing is desired, are input to the clock signal terminal SCKT of the semiconductor memory device 10 from the host computer and the data to be written as initial data is input to the data signal terminal SDAT synchronously with the clock signal and stored in the 8-bit latch register 170. In the embodiment, the write data is written to the 8-bit per line memory array 100 in units of 8 bits.

The write lock controller 180 determines whether or not the address to which writing is requested comprises an address included in the write-restricted area WRA (step S200), and if it determines that the address is not within the write-restricted area WRA (step S200: No), it does not issue a write-prohibit signal to the increment controller 150. As a result, a process to write data in 8-bit units to the requested addresses, and more specifically to the area that will subsequently comprise a write-prohibited area, is executed by the write/read controller 140 (step S202).

Specifically, the increment controller 150 that has not received a write-prohibit signal from the write lock controller 180 transmits a write enable signal WEN1 to the write/read controller 140. As described above, the write/read controller 140 has received an access enable signal AEN from the ID comparator 130 and in addition receives the write enable signal WEN1 from the increment controller 150. The write/read controller 140 that received both the access enable signal AEN and the write enable signal WEN1 outputs a write enable signal WEN2 to the IN/OUT controller 120. The IN/OUT controller 120 that received the write enable signal WEN2 changes the data transfer direction for the memory array 100 to the write direction (i.e., to the input state), thereby enabling data transfer to the memory array 100.

Consequently, the values of the write data DI ('0' or '1') are transferred to each bit line of the memory array 100. Specifically, the write/read controller 140 issues a request to the charge pump circuit 160 to generate a write voltage after the rising of the $8^{th}$ cycle of the clock signal SCK following the write standby state is entered, as shown in FIG. 7. The write voltage generated by the charge pump circuit 160 is impressed to the bit lines selected by the column selection circuit 103, and in this embodiment, to all bit lines. As a result, the data values '1' and '0' for the 8 bits stored in the 8-bit latch register 170 are written at the same time to a write-restricted row.

As shown in FIG. 7, during the clock low period following the falling of the $8^{th}$ cycle of the clock signal SCK, a verification process is executed to verify whether or not the existing data DE that was just written matches the write data DI used for writing. In other words, during the clock low period, the count value used to specify the addresses of the 8-bit existing data DE that was just written by the four-bit counter 151 included in the increment controller 150 is input to the column selection circuit 103 and the row selection circuit 104. Consequently, the just-written 8-bit existing data DE is output from the IN/OUT controller 120 and is stored in the 8-bit internal register 153 incorporated in the increment controller 150 via the IN/OUT controller 120. The increment controller 150 verifies whether or not the 8-bit existing data DE stored in the 8-bit internal register 153 matches the 8-bit write data DI stored in the 8-bit latch register 170.

The write lock controller 180 determines whether or not the write target address corresponds to the start address of the write-prohibited area (step S204). If it matches the start address of the write-prohibited area (step S204: Yes), the pass-through flag is set to ON (step S206). If the write lock controller 180 determines that the write target address does not correspond to the start address of the write-prohibited area (step S204: No), the current value of the pass-through flag is maintained. Specifically, this corresponds to a situation in which the write target address is an address subsequent to the start address of the write-prohibited area.

After writing of the write data DI is completed, if a reset signal RST (='0' or 'Low') is input to the reset signal terminal RSTT from the host computer (step S212: Yes), the various controllers are initialized as described above and set to a standby state to wait for receipt of an operation code, whereupon the write process ends.

On the other hand, if clock signal SCK are continuously input to the clock signal terminal SCKT of the semiconductor memory device 10 from the host computer without a reset signal RST (='0' or 'Low') being input to the reset signal terminal RSTT (step S212: No), the count value of the address counter 110 is incremented by 1 in accordance with the falling of the $8^{th}$-cycle clock signal SCK (see FIG. 7) (step S214). In other words, the target address is incremented to the top address of the next byte. Simultaneously, the write data DI (next-byte data) to be written to the next addresses (data amounting to eight addresses) is input to the data signal terminal SDAT.

When the address counter 110 counts up to the number of clock pulses corresponding to the address 7FH, i.e., to 128, the address in the memory array 100 specified by the address counter 110 returns to the address 00H. In other words, at the moment that the value of the $8^{th}$ bit (top bit) of the 8-bit register of the address counter 110 becomes '1', the top address 00H of the EEPROM array 101 of the memory array 100 is specified as the next address to be accessed. That is, during the process of writing to the prescribed area of the EEPROM array 101 that will subsequently comprise the write-prohibited area, in principle, the process of writing to the line that includes the top address of the EEPROM array 101 (i.e., the first line that stores the data compared with the operation code) is the final write process. In this way, because the initial identification information ID match determination can be carried out using common identification information ID, and because the write protect information (W/L) can be stored later, the writing of data to the prescribed area of the EEPROM array 101 that will subsequently comprise the write-prohibited area can be carried out in a smooth and flexible manner.

Where it is determined that the address for which writing is requested is included in the write-restricted area WRA (step S200: Yes), the write lock controller 180 determines whether or not the pass-through flag is set to ON (step S208). In other words, it determines whether or not the write request entails access of the write-restricted area WRA that comes after the top address of the write-prohibited area.

If it is determined that the pass-through flag is set to ON (step S208: Yes), the write lock controller 180 issues a write-prohibit signal to the increment controller 150. As a result, a write enable signal WEN1 is not issued from the increment controller 150 to the write/read controller 140, and write processing to write to the write-restricted area WRA is not executed (step S210). Consequently, writing is not performed to the write-restricted area WRA after writing or reading is executed to the area of EEPROM array 101 that will become the write-prohibited area following the writing of the initial data. Because the memory array 100 of this embodiment is a memory array that is accessed sequentially starting with the top address, in order to reach the write-restricted area WRA after the top address of the write-prohibited area is accessed, the terminal address of the write-prohibited area must be passed through. Therefore, where noise is present in the clock signal and the count number has progressed, there is a danger that data may be written to an address different from the address in the write-restricted area WRA comprising the write target address or that data that should be written to the write-prohibited area may be written to the write-restricted area WRA. In particular, writing to the write-restricted area WRA of this embodiment is always controlled by the increment controller 150 such that only values larger than the value of the existing data are written, as described above and below. Therefore, there is a danger that erroneous writing in the write-restricted area WRA may hinder the incremental writing to the write-restricted area WRA. However, In this embodiment, where writing is to be executed to the write-restricted area WRA after the write-prohibited area is passed through, such writing is not performed, and therefore the likelihood of erroneous writing in the write-restricted area WRA can be reduced or prevented.

Where it is determined that the pass-through flag is not set to ON (step S208: No), the write lock controller 180 does not issue a write-prohibit signal to the increment controller 150. As a result, the increment controller 150 issues a write enable signal WEN1 to the write/read controller 140 and write processing is carried out to the write-restricted area WRA (step S212). At the time of factory shipment, testing must be carried out to ensure that this writing to the write-restricted area WRA can be carried out normally, and this write processing is therefore executed. During this write processing, writing is executed to the uppermost address of the write-restricted area WRA, for example, and hindrance to incremental writing after factory shipment is prohibited. In other words, the upper one or two bits of the eight bits of the first row are used for write testing, and the remaining 6 or 7 bits are used for storage of rewrite data.

Where writing to the write-restricted area WRA is not executed (step S210) or after writing is executed (step S212), when a reset signal RST (='0' or 'Low') is input from the host computer to the reset signal terminal RSTT (step S212: Yes), the various controllers are initialized as described above, the pass-through flag is set to OFF, the standby state to receive an operation code is entered, and write processing is ended.

On the other hand, where clock signal SCK are continuously input from the host computer to the clock signal terminal SCKT of the semiconductor memory device 10 without a reset signal RST (='0' or 'Low') being input from the host computer to the reset signal terminal RSTT (step S212: No), the count value of the address counter 110 is incremented by 1 in accordance with the falling of the $8^{th}$-cycle clock signal SCK (see FIG. 7) (step S214).

Returning to FIG. 4, where it is determined by the write lock controller 180 that the write protect information (W/L) is set to ON (i.e., is '1') (step S216: Yes), writing to the write-restricted area WRA is executed (step S122).

For example, a situation will be described in which the write data DI is data having a length of 16 bits, and there are two write-restricted rows (8 addresses×2). In this case, write data having a length of 16 bits is written to the memory array 100 comprising 8-bit rows. During write processing, first, the 8 bits of data beginning from the most significant bit (MSB) of the write data DI are sequentially latched to the 8-bit latch register 170 synchronously with the rising edges of the clock signal SCK. In addition, the existing data after the $8^{th}$ address of the memory array 100 is sequentially output to the data output signal line (data signal terminal SDA) synchronously with the falling edges of the clock signal SCK until a write enable signal WEN2 is output to the IN/OUT controller 120. The existing data DE output to the data output signal line is input to the increment controller 150 and is used together with the write data DI latched to the 8-bit register 170 to determine whether or not the write data in the increment controller 150 is a larger value than the existing data DE. This determination process is executed after the rising of the $8^{th}$-cycle clock signal (='1' or 'Hi') following the write-standby state.

The number of clock signal SCK pulses corresponding to the desired address to be accessed, i.e., to the address to which writing is sought, is input from the host computer to the clock signal terminal SCKT of the semiconductor memory device 10. The IN/OUT controller 120 that received the write enable signal WEN2 changes the data transfer direction of the memory array 100 to the write direction and clears the high-impedance setting of the signal line between the 8-bit latch register 170 and the IN/OUT controller 120, thereby permitting data transfer. As a result, the value of the write data DI ('0' or '1') is transferred to each bit line of the memory array 100. After the rising of the $8^{th}$-cycle clock signal SCK the following the write standby state, the write/read controller 140 requests that the charge pump circuit 160 generate write voltage, the generated voltage is impressed to the bit lines selected by the column selection circuit 103, i.e., to all bit lines in this embodiment, and the eight bits of data composed of the values '1' and '0' stored in the 8-bit latch register 170 are written at the same time to one of the write restricted rows.

When the $8^{th}$-cycle clock signal SCK falls, the count value of the address counter 110 is incremented by 1, and the write data DI (i.e., the second byte of data) to be written to the next addresses (i.e., to the next eight addresses) is retrieved. In addition, during the clock low period following the following of the $8^{th}$-cycle clock signal SCK, verification processing is performed to verify whether or not the just-written existing data DE matches the write data DI used for writing. In other words, during the clock low period, the count value used to specify the address of the just-written 8-bit existing data DE is input to the column selection circuit 103 and the row selection circuit 104 by the 4-bit counter 151 incorporated in the increment controller 150. As a result, the just-written 8-bit existing data DE is output from the IN/OUT controller 120 and is stored in the 8-bit internal register 153 incorporated in the increment controller 150 via the IN/OUT controller 120. The increment controller 150 verifies whether or not the 8-bit existing data DE stored in the 8-bit internal register 153 matches the 8-bit write data DI stored in the 8-bit latch register 170.

In this embodiment, because the write data DI comprises data having a length of 16 bits and the write-restricted row comprises two rows (8 addresses×2), when the above processing is executed twice, writing of the write data DI to the write-restricted rows is completed. In other words, the write/read controller 140 executes write processing of the write data DI to the write-restricted area WRA until the top address of the write-prohibited area WPA is specified as the next access target address (step S122: No). When the top address of the write-prohibited area WPA is specified as the next access target address (step S122: Yes), the write/read controller 140 requests that the charge pump circuit 160 stop generating write voltage (step S124), whereupon the processing routine ends. Because data cannot be written to (stored in) the EEPROM array 101 unless the write voltage generated by the charge pump circuit 160 is used, write processing is stopped when the generation of write voltage by the charge pump circuit 160 is stopped.

After writing of the write data DI is completed, the input of a reset signal RST (='0' or 'Low') from the host computer to the reset signal terminal RSTT causes the semiconductor memory device 10 to enter a standby state to wait for receipt of an operation code, whereupon write processing ends.

The write data transmitted from the host computer has the same value ('0' or '1') as the data currently stored in the memory array 100, excluding the data corresponding to the addresses sought to be rewritten. In other words, the data for the addresses in the memory array 100 that are not to be rewritten is overwritten with the same values.

Figure 8:
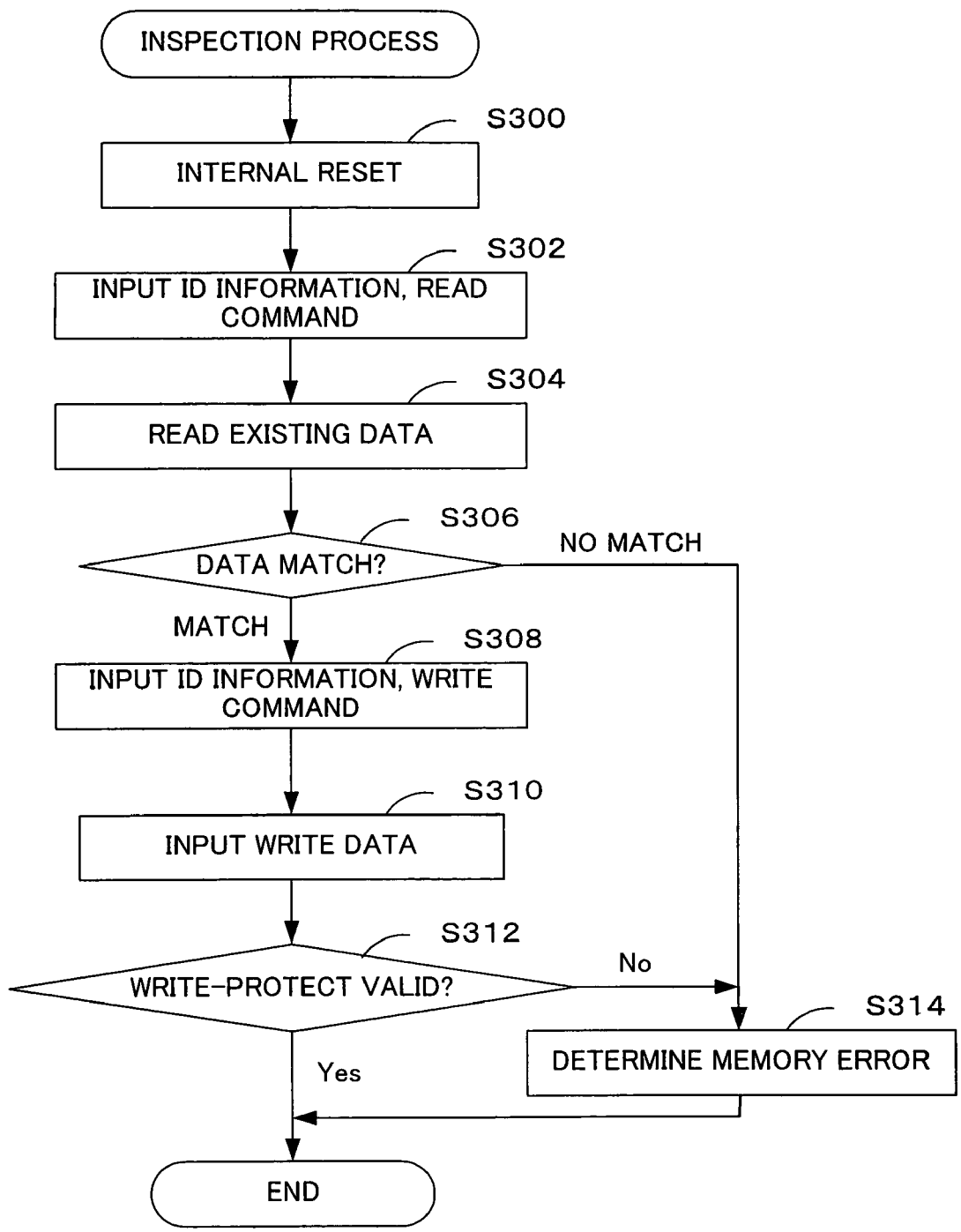
FIG. 8 is a flow chart showing the sequence of operations of a verification process carried out regarding the semiconductor memory device at the time of factory shipment.

The verification executed at the time of factory shipment will now be described with reference to FIG. 8. FIG. 8 is a flow chart showing the processing routine for the verification executed regarding the semiconductor memory device at the time of factory shipment.

The host computer outputs a reset signal to the reset signal terminal RSTT and the semiconductor memory device 10 is internally reset (step S300). As described above, an internal reset of the semiconductor memory device 10 is carried out by initializing the prescribed controllers upon the receipt of the reset signal RST. The host computer outputs identification information ID and a read command to the data signal terminal SDAT (step S302) and reads out the existing data stored in the memory array 100 (step S304). In the semiconductor memory device 10, after the processing described above is carried out by the ID comparator 130 and the write/read controller 140, the data stored in the memory array 100 is output to the data signal terminal SDAT. The values identification information ID=(1,1,1) and write protect information (W/L)=0, for example are stored in the semiconductor memory device 10 as default values. In this case, the host computer outputs identification information ID=(1,1,1) to the semiconductor memory device 10.

The host computer then determines whether or not the data that should be stored as existing data (initial data) matches the existing data (step S306), and if the data does not match (step S306: No), a memory error is recorded (step S304) and the processing routine ends. If the data does match, on the other hand (step S306: Yes), the host computer outputs the identification information ID and a write command to the data signal terminal SDAT (step S308).

The host computer outputs write data including the write data to be written to the write-prohibited area WPA to the data signal terminal SDAT synchronously with the clock signal SCK step S310). The host computer then determines whether or not data has been written to the write-prohibited area WPA, i.e., whether or not the write lock is valid (step S312), and if it is determined that the write lock is valid (step S312: Yes), the processing routine ends. If the host computer determines that the write lock is not valid, on the other hand, i.e., if writing to the write-prohibited area WPA has been executed (step S312: No), a memory error message is recorded (step S314) and the processing routine ends.

The determination regarding the validity of the write lock is carried out by, for example, reading out data from the memory array 100 after the write data is input and comparing it with the initial data used in step S304. In other words, if the two items of data match, this means that the writing of data to the write-prohibited area WPA was not performed, and accordingly it can be determined that the write lock is valid.

The validity of the write lock can also be determined by determining whether or not writing to the write-restricted area WRA is being carried out normally. In this embodiment, because only data having a value larger than that of the existing data can be written to the write-restricted area WRA, when initial data is written to the write-prohibited area WPA, i.e., where the write protect information (W/L) is ON (i.e., '1'), erroneous writing to the write-restricted area WRA is prevented by prohibiting writing thereto. Therefore, where writing to the write-restricted area WRA can be performed, it can be decided that the write protect information (W/L) is valid.

Figure 9:
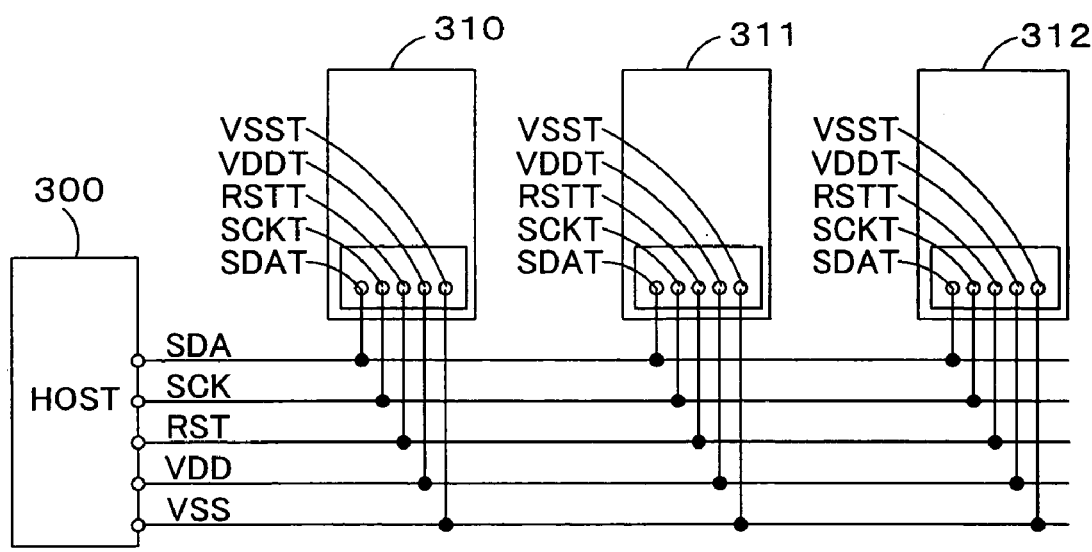
FIG. 9 is an explanatory drawing showing an example of an application of the semiconductor memory device of the embodiment.

Application examples of the semiconductor memory device 10 of the embodiment will now be described with reference to FIG. 9. FIG. 9 is an explanatory drawing showing an example of the application of the semiconductor memory device of the embodiment. The semiconductor memory device 10 of the embodiment is incorporated in each of several housing containers that house a consumable item, such as ink containers 310, 311, 312 that house ink comprising a print recording material. When the ink containers 310, 311, 312 are installed in a printing apparatus, they are each connected via bus connection to the host computer 300 incorporated in the printing apparatus. In other words, a data signal line SDA, clock signal line SCK, reset signal line RST, positive electrode power line VDD and negative electrode power line VSS are connected from the host computer 300 to the semiconductor memory devices 10 of the ink container 310, 311, 312. In this application example, ink amount information regarding either the amount of ink remaining or the amount of ink consumed is stored in each semiconductor memory device 10.

As described above, according to the semiconductor memory device 10 of this embodiment, the writing of data to the write-restricted area WRA after a prescribed area of the EEPROM array 101 that will become a write-prohibited area WPA has been accessed can be prohibited through a combination of write protect information (W/L) and a pass-through flag. As a result, even where target address access has progressed beyond the original access target address due to the presence of noise in the clock signal, the occurrence of a situation in which data to be written to the write-prohibited area WPA is written to the write-restricted area WRA, or in which data is erroneously written to the write-restricted area WRA, can be reduced or prevented.

Where the write-restricted area WRA permits only the writing of data having a value larger than that of existing data, the erroneous writing of data to the write-restricted area WRA is a problem. In other words, where the ink remaining amount (or consumption amount) is recorded in the write-restricted area WRA, if the value corresponding to a 50% remaining amount (or consumed amount) is erroneously written at the time of factory shipment, a remaining amount of 100%-50% (i.e., a consumption amount of 0%-50%) cannot be recorded. This problem can be eliminated through the use of the semiconductor memory device 10 of this embodiment.

Moreover, according to the semiconductor memory device 10 of the embodiment, the writing of data to a prescribed area in the EEPROM array 101 can be prevented via the write protect information (W/L). The prescribed area that will comprise the write-prohibited area WPA is specified based on information stored in the EEPROM array 101 as write-lock area information WLD, for example.

OTHER EMBODIMENTS (1) In the above embodiment, a write-prohibit signal to stop the issuance of the write enable signal WEN1 is output from the write lock controller 180 to the increment controller 150, but it is acceptable if the write-prohibit signal is issued directly from the write lock controller 180 to the write/read controller 140 separately from the write enable signal WEN1. In this case, when the write-prohibit signal is received from the write lock controller 180, the write/read controller 140 cannot issue a write enable signal WEN2 to the I/O controller 120 even if the write enable signal WEN1 and the access enable signal AEN are received, or request that the charge pump circuit 160 generate write voltage.

(2) In the above embodiment, a separate write lock controller 180 was included and processing to read and manage the write protect information (W/L) and the pass-through flag was executed by the write lock controller 180, but a separate write lock controller 180 need not be employed. In this case, the above functions of the write lock controller 180 may be executed by the write/read controller 140, for example.

(3) In the above embodiment, when data is written to the prescribed area of the EEPROM array 101 that will become the write-prohibited area WPA, the writing is performed in 8-bit units, but data may be written in 1-bit units or units of some other size.

(4) In the above embodiment, information specifying the write-prohibited area WPA in units of bytes was used as the write-lock area information WLD, but information specifying the write-prohibited area WPA in address units may be used instead.

(5) In the above embodiment, ink cartridges were used in the application example, but the same effect may be achieved with toner cartridges. Furthermore, the same effect may also be achieved where the above embodiment is applied in a medium that stores information equivalent to cash, such as a prepaid card.

(6) The verification processing executed in the above embodiment may be executed in 8-bit units using existing data DE1 latched in the 8-bit internal register 153 and write information DI1 latched in the 8-bit latch register 170 using a 4-bit counter and the internal oscillator 162. Alternatively, it may be carried out through a bit-by-bit comparison of (i) the first byte of the write data DI1 discharged in one-bit units from the 8-bit latch register 170 beginning with the MSB and (ii) the existing data DE1 read out in one-bit units from the first write-restricted row of the memory array 100 beginning with the MSB, without using the 4-bit counter 151 and the 8-bit internal register 153. In this case, the increment controller 150 is not needed.

(7) While the above embodiment was described using an example of write data having a length of 16 bits, the above embodiment may be applied to data having a data length that is any multiple of the bit length of one row of the memory array 100, i.e. 24 bits, 32 bits or the like, and the same effect may be achieved.

While the semiconductor memory device and semiconductor memory device access control method of the present invention were described based on several examples, the embodiment provided above were provided solely for ease of understanding, and the present invention is not limited thereby. The present invention may be modified or improved within its essential nature and within the scope of the Claims herein, and equivalents to the present invention are naturally included therein. Finally, the present application claims the priority based on Japanese Patent Application No. 2005-231503 filed on Aug. 10, 2005, which is herein incorporated by reference.

What is claimed is:

1. A semiconductor memory device comprising:
 a memory array that is sequentially accessed starting with the top address and contains a rewritable area used for storage of rewritable data and a write-prohibited area that is used for storage of read-only data and follows the rewritable area;
 an access request receiving unit that receives access requests for access of a desired address in said memory array;
 a flag setting unit that sets a flag to ON when said write-prohibited area has been accessed; and
 a memory controller that controls access of said memory array and does not write data to said desired address if said desired address is included in said rewritable area and said flag is set to ON.

2. A semiconductor memory device according to claim 1, wherein said memory controller determines with reference to information specifying the write-prohibited area in said memory array whether said desired address is included in said write-prohibited area.

3. A semiconductor memory device according to claim 2, wherein said memory controller executes read-only access of data from said desired address if said access controller determines said desired address is included in said write-prohibited area with reference to information specifying the write-prohibited area in said memory array.

4. A semiconductor memory device according to claim 2, wherein said memory controller writes data to said desired address if said access controller determines said desired address is included in said rewritable area but that said flag is not set to ON with reference to information specifying the write-prohibited area in said memory array.

5. A semiconductor memory device according to claim 2, wherein said information specifying the write-prohibited area is written in the area extending from said top address to said rewritable area.

6. A semiconductor memory device according to claim 5, wherein identification information that identifies said semiconductor memory device is also written in the area extending from said top address to said rewritable area.

7. A semiconductor memory device according to claim 5, wherein said flag setting unit sets said flag to OFF upon receiving input of a reset signal.

8. A semiconductor memory device according to claim 1, wherein said flag ON or flag OFF setting information is stored in said memory controller.

9. A semiconductor memory device according to claim 8, wherein said flag setting unit sets said flag to OFF upon receiving input of a reset signal.

10. A semiconductor memory device according to claim 1, wherein said memory controller further comprises:
 a write-prohibition controller that issues a write-prohibit signal that prohibits writing of data to said desired address if said desired address is included in said rewritable area with reference to information specifying the write-prohibited area in said memory array and said flag is set to ON, and
 a writing execution unit that does not write data to said memory array where a write-prohibit signal is received from said write-prohibition controller.

11. A print recording material container containing print recording material and detachably mounted to a printing apparatus, said print recording material container comprising:
 a containing chamber that contains said print recording material; and
 the semiconductor memory device according to any of claims 1 through 10.

12. A printing system that comprises a printing apparatus and the print recording material container according to claim 11 detachably mounted to the printing apparatus, wherein
 said printing apparatus includes a host computer that has bus connections to the semiconductor memory device installed on said print recording material container via a data signal line, a clock signal line, a reset signal line, a positive electrode power line and a negative electrode power line, and that transmits to the semiconductor memory device information regarding the amount of print recording material consumed in said printing apparatus, and the semiconductor memory device stores in said memory array the received information regarding the amount of print recording material.

13. A control apparatus for a semiconductor memory device that includes a memory array that is accessed sequentially starting with the top address and that contains a rewritable area used for storage of rewritable data and a write-prohibited area that follows the rewritable area and is used for storage of read-only data, said control apparatus comprising:

an access request receiving unit that receives access requests for access of a desired address in said memory array of said semiconductor memory device;

a flag setting unit that sets a flag to ON when said write-prohibited area has been accessed; and an access controller that controls access of said memory array of said semiconductor memory device, and that does not write data to said desired address if the access controller determines said desired address is included in said rewritable area with reference to information specifying the write-prohibited area in said memory array and that said flag is set to ON.

14. An access control method for a semiconductor memory device that comprises a memory array that is accessed sequentially starting with the top address and that contains a rewritable area used for storage of rewritable data and a write-prohibited area that follows the rewritable area and is used for storage of read-only data, the method comprising:

receiving an access request for access of a desired address in said memory array;

referring to information that specifies the write-prohibited area in said memory array; and not writing data to said desired address if said desired address is included in said rewritable area and if a flag that is set to ON when said write-prohibited area has been accessed is set to ON.

* * * * *